(12) United States Patent
Jung

(10) Patent No.: US 7,161,840 B2
(45) Date of Patent: Jan. 9, 2007

(54) ERASE METHOD IN FLASH MEMORY DEVICE

(75) Inventor: Jin Hyo Jung, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/024,628

(22) Filed: Dec. 30, 2004

(65) Prior Publication Data

US 2005/0141286 A1 Jun. 30, 2005

(30) Foreign Application Priority Data

Dec. 31, 2003 (KR) .................... 10-2003-0101767

(51) Int. Cl.
*G11C 16/04* (2006.01)
(52) U.S. Cl. .............. 365/185.29; 365/185.28
(58) Field of Classification Search ............ None
See application file for complete search history.

(56) References Cited

U.S. PATENT DOCUMENTS 5,742,541 A * 4/1998 Tanigami et al. ........ 365/185.3
6,160,740 A * 12/2000 Cleveland .............. 365/185.29
6,847,557 B1 * 1/2005 Yang .................... 365/185.29

* cited by examiner

*Primary Examiner*—Thong Q. Le
(74) *Attorney, Agent, or Firm*—Oblon, Spivak, McClelland, Maier & Neustadt, P.C.

(57) ABSTRACT

An erase method in a flash memory device by which over-erase of the flash memory device is prevented. The method includes applying an electric field to a structure between the control gate and the semiconductor substrate by applying negative and positive voltages to the control gate and the semiconductor substrate, respectively. The method further includes weakening an intensity of the electric field applied to the tunnel oxide layer according to a progress of an erase time, and simultaneously, relatively strengthening an intensity of the electric field applied to the first and second block oxide layers to constantly maintain a pre-scribed quantity of electrons on a conduction band of the floating gate.

6 Claims, 5 Drawing Sheets

ERASE METHOD IN FLASH MEMORY DEVICE

BACKGROUND OF THE INVENTION

1. Field of the Invention

The present invention relates to an erase method in a flash memory device by which over-erase of the flash memory device is prevented.

2. Discussion of the Related Art

An exemplary device among various semiconductor memory devices is a non-volatile memory device. A user programs the non-volatile memory device by switching a memory state in an electrical manner. The non-volatile memory device is capable of sustaining its memory state even if power is shut down. Non-volatile memory devices are classified into a floating gate series and an MIS (metal-insulator-semiconductor) series having at least two kinds of stacked dielectric layers.

The floating gate series non-volatile memory device implements its memory characteristics using a potential well. The ETOX (RPOM tunnel oxide) structure used as flash EEPROM (electrically erasable & programmable read only memory) is a representative one thereof. The MIS series non-volatile memory device performs its memory function using traps existing in a dielectric layer, a bulk, a dielectric-to-dielectric interface, and a dielectric-to-semiconductor interface.

A typical structure of the floating gate series non-volatile memory device and program and erase methods using the same are explained with reference to the drawings as follows.

FIG. 1 is a cross-sectional diagram of an ETOX memory device as the floating gate series non-volatile memory device according to a related art.

Referring to FIG. 1, a tunnel oxide layer 102, a floating gate 103, a dielectric layer 104, and a control gate 105 are sequentially stacked on a p type semiconductor substrate 101. A source region S and a drain region D are formed in the substrate below both sides of the stacked structure, respectively. The dielectric layer 104 is generally formed of an ONO (oxide-nitride-oxide) layer to raise a coupling ratio.

Program and erase methods of the above-configured floating gate series non-volatile memory device are performed in the following manner. In the program method, electrons are injected in a potential well formed in a floating gate by hot electron injection or F-N (Fowler-Nordheim) tunneling to raise threshold voltage.

In the erase method, holes are injected by hot hole injection to recombine the holes and electrons or the electrons are drained out to a substrate to lower the threshold voltage.

In performing the erase process using the floating gate series non-volatile memory device according to the related art, a problem of over-erasing may take place. Over-erasing occurs when electrons stored in the floating gate are excessively drained, making the threshold voltage negative. Even if only one over-erased cell exists on a bit line in a non-volatile memory device circuit, over-current flows in the bit line, causing failures in reading data of other cells which are not over-erased.

FIG. 2 is a graph of memory cell number distribution to a threshold voltage in performing program and erase processes using a floating gate series non-volatile memory device according to a related art. Program and erase states having prescribed voltage distributions are shown in which each voltage of the program and erase states indicates a threshold voltage ($V_T$) window W.

Referring to FIG. 2, there exists a cell 'a' for which the threshold voltage is below 0V due to over-erasing. A threshold voltage distribution in erase is thus wider than that in program. Once the threshold voltage distribution in erase is widened, a threshold voltage window W between the program and erase states is shortened, degrading characteristics of the flash memory device.

There are various reasons that may cause over-erasing, such as a line width in an active area, a tunnel oxide layer thickness, a junction overlap, a damaged tunnel oxide, local thinning of the tunnel oxide layer, pin holes, and the like. As there are various reasons that cause over-erasing, the related art method raises the threshold voltage of an over-erased cell to reprogram the corresponding cell, instead of fixing the root cause of the over-erasing. In the related art reprogramming method, the corresponding test time is too long and an additional circuit for restoring the over-erased cell is needed.

SUMMARY OF THE INVENTION

Accordingly, the present invention is directed to an erase method in a flash memory device that substantially obviates one or more problems due to limitations and disadvantages of the related art.

The present invention advantageously provides an erase method in a flash memory device, by which over-erase of the flash memory device is prevented while performing an erase process and by which voltage distributions of erase and program modes are narrowed to secure a stable threshold voltage window.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, in a flash memory device, which includes a tunnel oxide layer, a floating gate, a first block oxide layer, a second block oxide layer having an energy band gap higher than that of the first block oxide layer, and a control gate sequentially stacked on a semiconductor substrate, an erase method in the flash memory device according to the present invention includes the steps of applying an electric field to a structure between the control gate and the semiconductor substrate by applying negative and positive voltages to the control gate and the semiconductor substrate, respectively, and weakening an intensity of the electric field applied to the tunnel oxide layer according to a progress of an erase time, and simultaneously, relatively strengthening an intensity of the electric field applied to the first and second block oxide layers, to constantly maintain a prescribed quantity of electrons on a conduction band of the floating gate.

In an exemplary embodiment, the intensity weakening and strengthening step includes an initial erase step of lowering a threshold voltage of the floating gate by electron movement from the floating gate to the semiconductor substrate due to applying the electric field relatively higher than that of the first and second block oxide layers to the tunnel oxide layer by the electrons stored in the floating gate, an intermediate erase step of lowering the threshold voltage at a speed relatively lower than a threshold voltage lowering speed of the initial erase step by supplying a prescribed quantity of the electrons to the floating gate from the control gate to the floating gate in a manner of raising the electric field applied to the first and second block oxide layers to be higher than that in the initial erase step due to the electron movement from the floating gate in the initial erase step, and simultaneously, by continuing the electron movement from the floating gate, and a final erase step of sustaining a threshold voltage of the control gate at a prescribed level by minimizing the electron movement from the floating gate in a manner of minimizing the electric field applied to the tunnel oxide layer due to the electron movement from the floating gate in the intermediate erase step, and simultaneously, by supplying a prescribed quantity of the electrons to the floating gate from the control gate in a manner of maximizing the electric field applied to the first and second block oxide layers.

In an exemplary embodiment, the first block oxide layer is formed of either $Al_2O_3$ or $Y_2O_3$, the second block oxide layer is formed of $SiO_2$, and the tunnel oxide layer is formed of $SiO_2$.

It is to be understood that both the foregoing general description and the following detailed description of the present invention are exemplary, but are not restrictive of the invention.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to exemplary embodiments of the present invention, which are illustrated in the accompanying drawings. Wherever possible, the same reference numbers will be used throughout the drawings to refer to the same or like parts.

Figure 1:
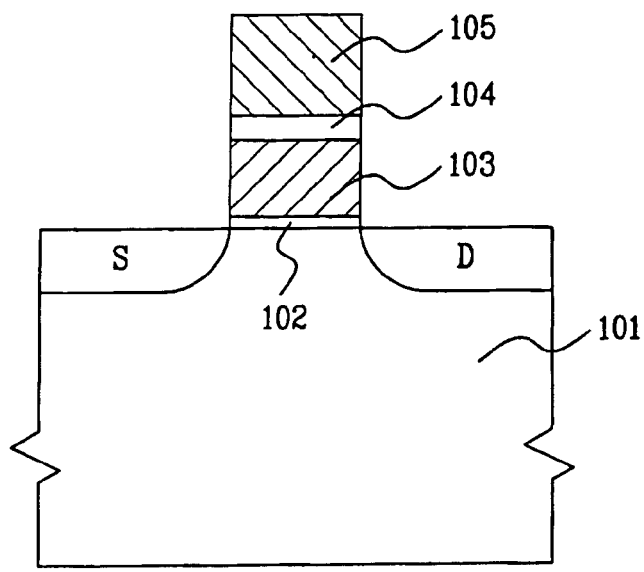
FIG. 1 is a cross-sectional diagram of an ETOX memory device as the floating gate series non-volatile memory device according to a related art.
Figure 2:
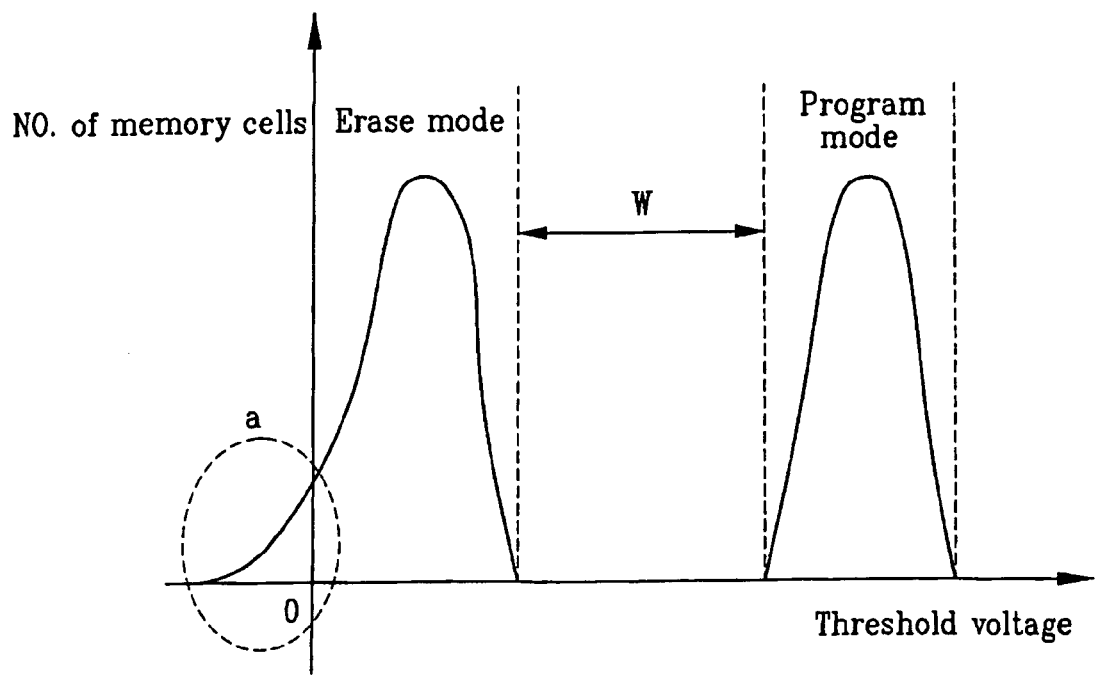
FIG. 2 is a graph of memory cell number distribution to a threshold voltage in performing program and erase processes using a floating gate series non-volatile memory device according to a related art.
Figure 3:
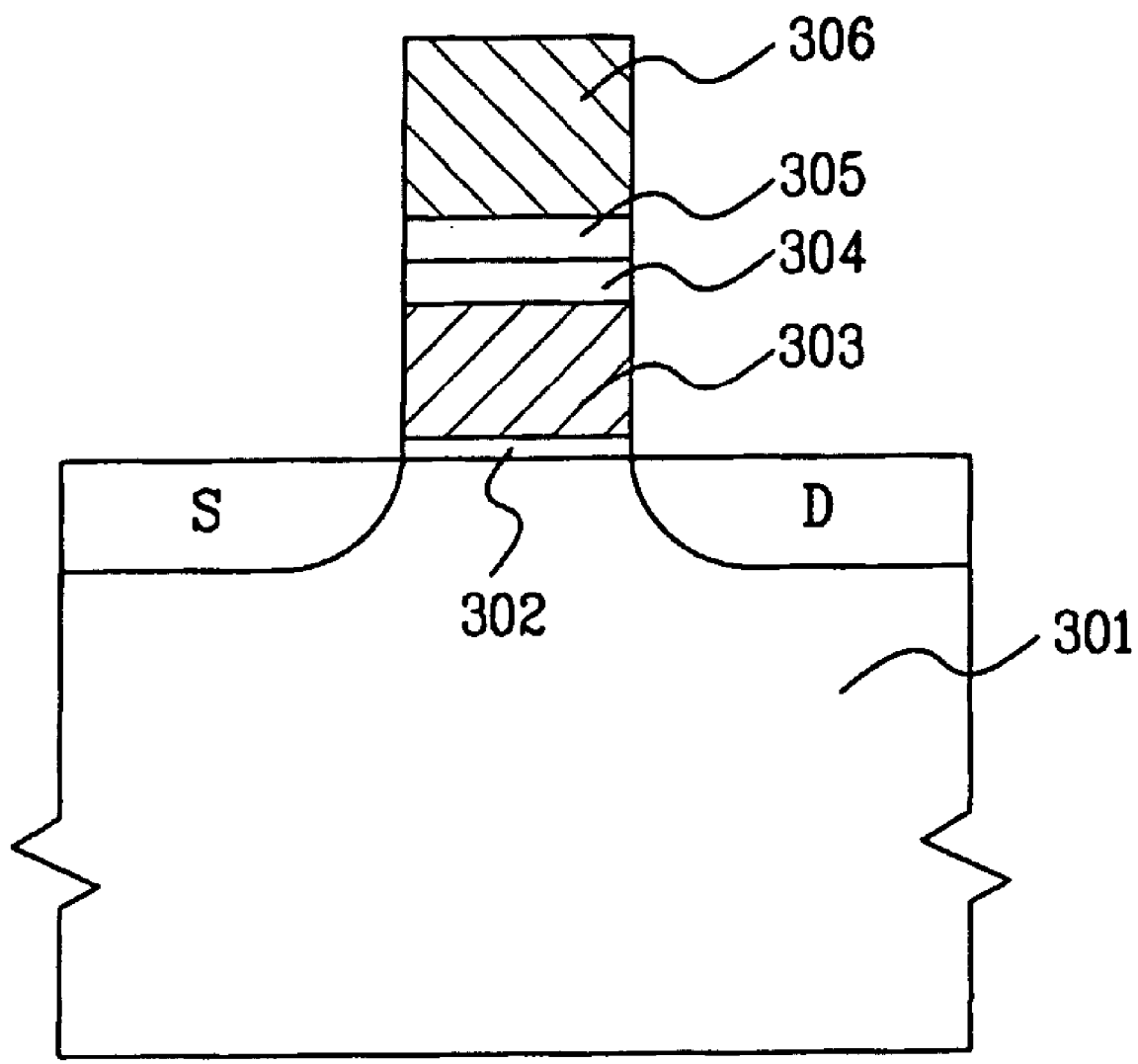
FIG. 3 is a cross-sectional diagram of a flash memory device applicable to the present invention.

FIG. 3 is a cross-sectional diagram of a flash memory device applicable to the present invention.

Referring to FIG. 3, a tunnel oxide layer 302, a floating gate 303, a first block oxide layer 304, a second block oxide layer 305, and a control gate 306 are sequentially stacked on a semiconductor substrate 301 in an active area defined by a device isolation layer on the substrate 301. A source region S and a drain region D are formed in the substrate below both sides of the stacked structure, respectively. The tunnel oxide layer may be formed of a silicon oxide layer. The semiconductor substrate 301 can employ an n or p type semiconductor substrate. For convenience of explanation, the p type semiconductor substrate 301 is employed in the following description.

The second block oxide layer 305 may be formed of a material having a dielectric constant and energy band gap (Eg) lower than those of the first block oxide layer 304. For example, $Al_2O_3$ or $Y_2O_3$ is used as the first block oxide layer 304 while $SiO_2$ is used as the second block oxide layer 305. In this case, the dielectric constants of $Al_2O_3$ and $Y_2O_3$ are 8.9 and 17, respectively, while the dielectric constant of $SiO_2$ is 3.9. For reference, a dielectric constant of silicon nitride for the related art ONO layer is 7.5. By forming the dielectric layer with the first and second block oxide layers 304 and 305, a coupling ratio thereof can be raised higher than that of the related art ONO dielectric layer.

An erase method in the above-configured flash memory device according to the present invention is explained as follows.

Figure 4A:
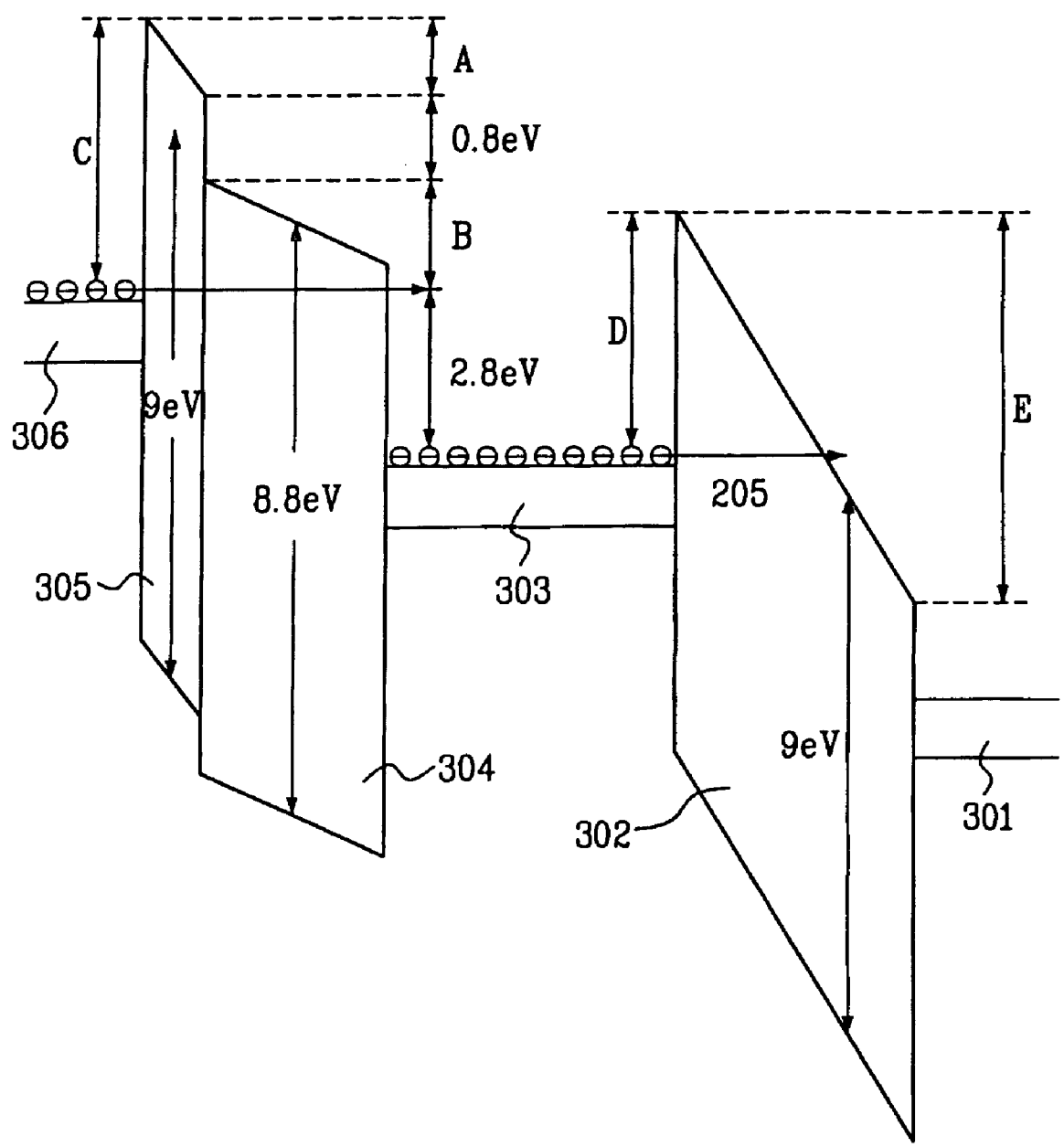
FIGS. 4A to 4C are diagrams of energy bands and electron migrations through control gate/second block oxide layer/first block oxide layer/floating gate/tunnel oxide layer/substrate along a cutting line A–A' in an erase method according to the present invention.
Figure 4B:
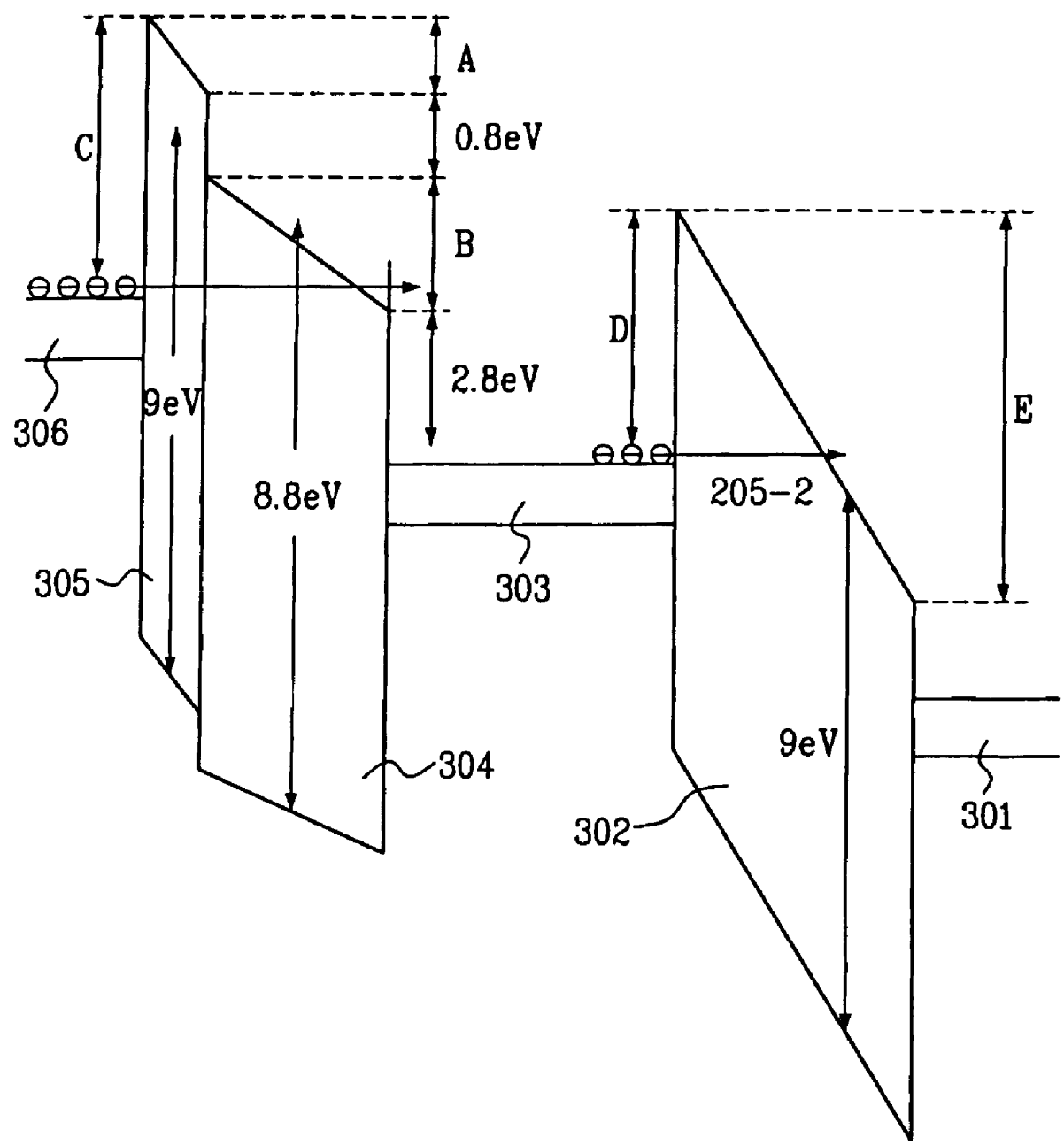
Figure 4C:
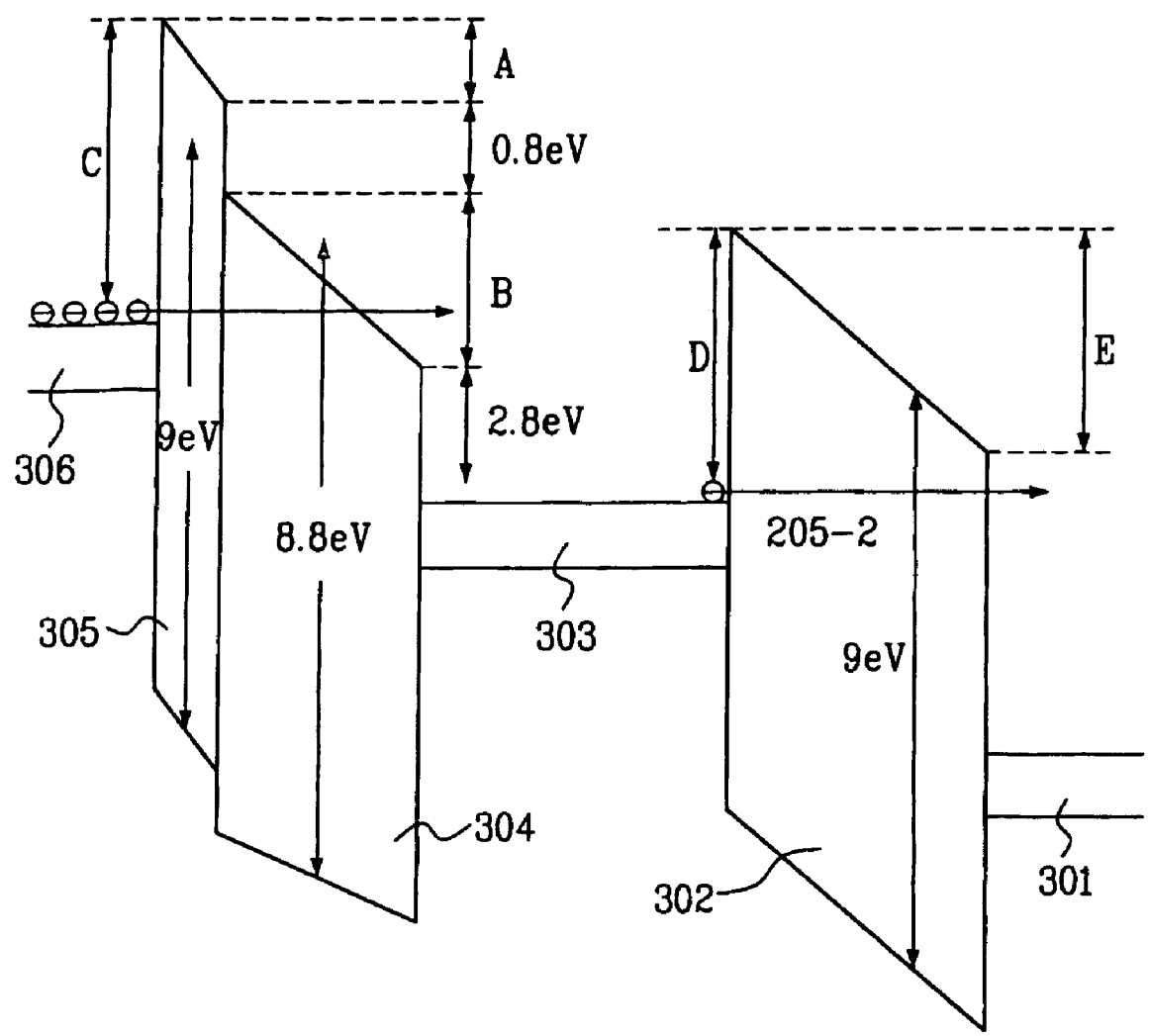

FIGS. 4A to 4C are diagrams of energy bands and electron migrations through control gate/second block oxide layer/first block oxide layer/floating gate/tunnel oxide layer/substrate along a cutting line A–A' in an erase method according to the present invention.

In order to switch to an erase mode from a program mode, a negative voltage, e.g., (−)7V, is applied to the control gate 306 and a positive voltage, e.g., +7V, is applied to the substrate 301. Hence, an electric field is generated between the control gate 306 and the substrate 301 by the voltage differential. In an energy band diagram of the first and second block oxide layers 304 and 305 and the tunnel oxide layer 302 configuring the flash memory device of the present invention, a slope occurs in a potential of a conduction band by the generated electric field. Since a multitude of electrons are stored in the floating gate 303 in the program mode, the electric field applied to the tunnel oxide layer 302 is relatively greater than that applied to the first and second block oxide layers 304 and 305.

In order to explain the erase method shown in FIGS. 4A to 4C, an overall erase process is divided into an initial erase stage, an intermediate erase stage, and a final erase stage according to time.

The initial erase stage is explained as follows. The electric field difference creates slopes in the energy bands of the first and second block oxide layers. As the energy band potential is sloped, an energy difference between conduction bands occurs even in the same substance. The slope of the energy band potential is proportional to intensity of the applied electric field. For convenience of explanation, the energy difference between conduction bands is called a conduction band energy gap in the following description.

Since the applied electric field is relatively weak in the initial erase stage, the slope of the energy band potential, as shown in FIG. 4A, is relatively gentle. In the initial erase stage, a total sum of a conduction band energy gap A of the second block oxide layer 305 and an energy difference (0.8 eV) between the conduction bands of the first and second block oxide layers 304 and 305 is smaller than an energy difference C between the conduction bands of the control gate 306 and the second block oxide layer 305. Hence, electrons existing on the conduction band of the control gate 306 fail to perform F-N tunneling, but pass through an overall thickness of the first and second block oxide layers 304 and 305. Accordingly, control gate 306 is unable to supply electrons to the conduction band of the floating gate 303.

In the case of the tunnel oxide layer 302, the electric field applied to the tunnel oxide layer 302 is relatively higher than that applied to the first and second block oxide layers 304 and 305. A conduction band energy gap E of the tunnel oxide layer is greater than an energy difference D between the conduction bands of the control gate 306 and the tunnel oxide layer 302. Thus, electrons stored at the conduction band of the floating gate 303 can perform F-N tunneling to drain into the substrate 301.

Thus, in the initial erase stage, electrons move to the substrate 301 from the floating gate 303, while electrons do not move to the floating gate 303 from the control gate 306. Hence, a threshold voltage of the floating gate 303 continuously drops.

After the lapse of a prescribed time for the initial erase stage, the number of the electrons stored on the conduction band of the floating gate 303, as shown in FIG. 4B, is decreased. In the intermediate erase stage, the electric field applied to the tunnel oxide layer 302 is weakened as well. In contrast, the intensity of the electric field applied to the first and second block oxide layers 304 and 305 are relatively raised. The slopes of the energy band potentials of the first and second block oxide layers 304 and 305 become steeper than those in the initial erase stage. A total energy value of the conduction band energy gap B of the first block oxide layer 304, the conduction band energy gap A of the second block oxide layer 305, and the energy difference (0.8 eV) between the conduction bands of the first and second block oxide layer 304 and 305 is greater than the energy difference between the conduction bands of the control gate 306 and the second block oxide layer 305. Hence, the electrons on the conduction band of the control gate 306 move to the conduction band of the floating gate 303. The electrons of the control gate 306 perform direct tunneling through the second block oxide layer 305 and F-N tunneling through the first block oxide layer 304, which shall be called modified F-N tunneling hereinafter.

Even if the slope of the energy band potential of the tunnel oxide layer 302 becomes gentler in the intermediate erase stage, the conduction band energy gap of the tunnel oxide layer 302 is greater than the energy difference D between the conduction bands of the floating gate 303 and the tunnel oxide layer 302. Hence, the electrons stored in the conduction band of the floating gate 303 perform F-N tunneling to drain into the substrate 301.

Although the electron movement to the substrate 301 from the floating gate 303 continues, similar to the electron movement in the initial erase stage, electrons also flow into the floating gate 303 from the control gate 306. However, the quantity of the electrons draining into the substrate 301 from the floating gate 303 is relatively greater than the quantity of electrons moving from the control gate 306 to the floating gate 303. Accordingly, the threshold voltage of the floating gate 303 continues to drop, but at a lower rate than that of the initial erase stage.

After the above-explained intermediate erase stage continues for a prescribed time, almost no electrons, as shown in FIG. 4C, remain in the conduction band of the floating gate 303. Thus, the electric field applied to the tunnel oxide layer 302 is minimized through the overall erase process. Such a state continues during the final erase stage.

The electric field applied to the tunnel oxide layer 302 is minimized due to the continuous electron movement from the conduction band of the floating gate 303. In contrast, the electric field applied to the first and second block oxide layers 304 and 305 is maximized. Hence, the slopes of the energy band potentials of the first and second block oxide layers 304 and 305 become steeper than those of the initial or intermediate erase stages. As the slope of the energy band potential becomes steeper, a distance that the electrons on the conduction band of the control gate 306 travel the first and second block oxide layers 304 and 305 is shorter, accelerating the modified F-N tunneling. Thus, a quantity of electrons supplied to the conduction band of the floating gate 303 during the final erase stage is larger than that during the intermediate erase stage.

With regard to the tunnel oxide layer 302, as the slope of the energy band potential of the tunnel oxide layer 302 becomes gentler, the conduction band energy gap E of the tunnel oxide layer 302 becomes similar to the energy difference D between the conduction bands of the floating gate 303 and the tunnel oxide layer 302. Thus, the electrons stored in the conduction band of the floating gate 303 have difficulty in performing F-N tunneling. Hence, a quantity of the electrons draining to the substrate 301 from the floating gate 303 is minimized to almost zero.

In the final erase stage, the quantity of the electrons draining to the substrate 301 from the floating gate 303 is minimized, whereas a prescribed quantity of the electrons is supplied to the floating gate 303 from the control gate 306. Of course, the number of the electrons within the floating gate 303 is raised in the final erase stage, since the quantity of the electrons draining from the floating gate 303 is larger than that supplied from the control gate 306 to the floating gate 303. Yet, since the intensity of the electric field applied to the tunnel oxide layer 302 is raised in proportion to the raised quantity of the electrons, the electrons stored in the conduction band of the floating gate 303 will drain to the substrate 301 again by F-N tunneling. Namely, in the final erase stage, the incoming and outgoing quantities of the electrons become constant to sustain the threshold voltage of the floating gate 303 at a prescribed level. Hence, the threshold voltage converges. Thus, as the threshold voltage is uniformly sustained in the course of the erase process, the flash memory device avoids being over-erased and the threshold voltage distribution in erase can be narrowed. Accordingly, the shortening problem of the threshold voltage can be prevented. Further, the threshold voltage window between the program and erase modes is widened, improving the characteristics of the flash memory.

Accordingly, the present invention provides the following effects or advantages.

First of all, the related art ONO dielectric layer is replaced by the first and second block oxide layers having a coupling ratio better than that of the ONO layer. In performing the erase process, by supplying a prescribed quantity of electrons to the conduction band of the floating gate from that of the control gate, it is able to sustain the threshold voltage of the control gate uniformly.

Second, as the threshold voltage is uniformly maintained, the flash memory device avoids being over-erased.

Third, the distribution of the erase threshold voltage becomes narrower than the related art distribution thereof, and the threshold voltage window is not shortened.

Finally, by narrowing the distribution of the program threshold voltage accordingly, a multi-level bit cell of the flash memory device may be implemented.

Korean Patent Application No. P2003-0101767, filed on Dec. 31, 2003, is hereby incorporated by reference in its entirety.

It will be apparent to those skilled in the art that various modifications and variations can be made in the present invention. Thus, it is intended that the present invention covers the modifications and variations of this invention within the scope of the appended claims and their equivalents.

What is claimed is:

1. In a flash memory device, which includes a tunnel oxide layer, a floating gate, a first block oxide layer, a second block oxide layer having an energy band gap higher than that of the first block oxide layer, and a control gate sequentially stacked on a semiconductor substrate, an erase method in the flash memory device, comprising the steps of:

applying an electric field to a structure between the control gate and the semiconductor substrate by applying negative and positive voltages to the control gate and the semiconductor substrate, respectively; and weakening an intensity of the electric field applied to the tunnel oxide layer according to a progress of an erase time, and simultaneously, strengthening a relative intensity of the electric field applied to the first and second block oxide layers to control a slope of the energy band gap of the first block oxide layer, the second block oxide layer, and the tunnel oxide layer to constantly maintain a prescribed quantity of electrons on a conduction band of the floating gate.

2. In a flash memory device, which includes a tunnel oxide layer, a floating gate, a first block oxide layer, a second block oxide layer having an energy band gap higher than that of the first block oxide layer, and a control gate sequentially stacked on a semiconductor substrate, an erase method in the flash memory device, comprising the steps of:

applying an electric field to a structure between the control gate and the semiconductor substrate by applying negative and positive voltages to the control gate and the semiconductor substrate, respectively; and weakening an intensity of the electric field applied to the tunnel oxide layer according to a progress of an erase time, and simultaneously, strengthening a relative intensity of the electric field applied to the first and second block oxide layers to constantly maintain a prescribed quantity of electrons on a conduction band of the floating gate, wherein the step of weakening and strengthening intensities includes:

lowering a threshold voltage of the floating gate by electron movement from the floating gate to the semiconductor substrate in a manner of applying the electric field relatively higher than that of the first and second block oxide layers to the tunnel oxide layer by the electrons stored in the floating gate;

lowering the threshold voltage at a speed relatively lower than a threshold voltage lowering speed of the initial erase step by supplying a prescribed quantity of the electrons to the floating gate from the control gate in a manner of raising the electric field applied to the first and second bock oxide layers to be higher than that in the initial erase step due to the electron movement from the floating gate in the initial erase step, and simultaneously, by continuing the electron movement from the floating gate; and sustaining a threshold voltage of the control gate at a prescribed level by minimizing the electron movement from the floating gate in a manner of minimizing the electric field applied to the tunnel oxide layer due to the electron movement from the floating gate in the intermediate erase step, and simultaneously, by supplying a prescribed quantity of the electrons to the floating gate from the control gate in a manner of maximizing the electric field applied to the first and second block oxide layers.

3. In a flash memory device, which includes a tunnel oxide layer, a floating gate, a first block oxide layer, a second block oxide layer having an energy band gap higher than that of the first block oxide layer, and a control gate sequentially stacked on a semiconductor substrate, an erase method in the flash memory device, comprising the steps of:

applying an electric field to a structure between the control gate and the semiconductor substrate by applying negative and positive voltages to the control gate and the semiconductor substrate, respectively; and weakening an intensity of the electric field applied to the tunnel oxide layer according to a progress of an erase time, and simultaneously, strengthening a relative intensity of the electric field applied to the first and second block oxide layers to constantly maintain a prescribed quantity of electrons on a conduction band of the floating gate, wherein the first block oxide layer is formed of $Al_2O_3$ or $Y_2O_3$, wherein the second block oxide layer is formed of $SiO_2$, and wherein the tunnel oxide layer is formed of $SiO_2$.

4. In a flash memory device, which includes a tunnel oxide layer, a floating gate, a first block oxide layer, a second block oxide layer having an energy band gap higher than that of the first block oxide layer, and a control gate sequentially stacked on a semiconductor substrate, an erase method in the flash memory device, comprising:

a step for applying an electric field to a structure between the control gate and the semiconductor substrate by applying negative and positive voltages to the control gate and the semiconductor substrate, respectively; and a step for weakening an intensity of the electric field applied to the tunnel oxide layer according to a progress of an erase time, and simultaneously, strengthening a relative intensity of the electric field applied to the first and second block oxide layers to control a slope of the energy band gap of the first block oxide layer, the second block oxide layer, and the tunnel oxide layer to constantly maintain a prescribed quantity of electrons on a conduction band of the floating gate.

5. In a flash memory device, which includes a tunnel oxide layer, a floating gate, a first block oxide layer, a second block oxide layer having an energy band gap higher than that of the first block oxide layer, and a control gate sequentially stacked on a semiconductor substrate, an erase method in the flash memory device, comprising:

a step for applying an electric field to a structure between the control gate and the semiconductor substrate by applying negative and positive voltages to the control gate and the semiconductor substrate, respectively; and a step for weakening an intensity of the electric field applied to the tunnel oxide layer according to a progress of an erase time, and simultaneously, strengthening a relative intensity of the electric field applied to the first and second block oxide layers to constantly maintain a prescribed quantity of electrons on a conduction band of the floating gate, wherein the step for weakening and strengthening intensities includes:

an initial erase step for lowering a threshold voltage of the floating gate by electron movement from the floating gate to the semiconductor substrate in a manner of applying the electric field relatively higher than that of the first and second block oxide layers to the tunnel oxide layer by the electrons stored in the floating gate;

an intermediate erase step for lowering the threshold voltage at a speed relatively lower than a threshold voltage lowering speed of the initial erase step by supplying a prescribed quantity of the electrons to the floating gate from the control gate in a maimer of raising the electric field applied to the first and second bock oxide layers to be higher than that in the initial erase step due to the electron movement from the floating gate in the initial erase step, and simultaneously, by continuing the electron movement from the floating gate; and a final erase step for sustaining a threshold voltage of the control gate at a prescribed level by minimizing the electron movement from the floating gate in a maimer of minimizing the electric field applied to the tunnel oxide layer due to the electron movement from the floating gate in the intermediate erase step, and simultaneously, by supplying a prescribed quantity of the electrons to the floating gate from the control gate in a maimer of maximizing the electric field applied to the first and second block oxide layers.

6. In a flash memory device, which includes a tunnel oxide layer, a floating gate, a first block oxide layer, a second block oxide layer having an energy band gap higher than that of the first block oxide layer, and a control gate sequentially stacked on a semiconductor substrate, an erase method in the flash memory device, comprising:

a step for applying an electric field to a structure between the control gate and the semiconductor substrate by applying negative and positive voltages to the control gate and the semiconductor substrate, respectively; and a step for weakening an intensity of the electric field applied to the tunnel oxide layer according to a progress of an erase time, and simultaneously, strengthening a relative intensity of the electric field applied to the first and second block oxide layers to constantly maintain a prescribed quantity of electrons on a conduction band of the floating gate, wherein the first block oxide layer is formed of $Al_2O_3$ or $Y_2O_3$, wherein the second block oxide layer is formed of $SiO_2$, and wherein the tunnel oxide layer is formed of $SiO_2$.

* * * * *